(12) United States Patent
Collins

(10) Patent No.: US 7,192,495 B1
(45) Date of Patent: Mar. 20, 2007

(54) INTERMEDIATE ANNEAL FOR METAL DEPOSITION

(75) Inventor: Dale W. Collins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 344 days.

(21) Appl. No.: 10/651,765

(22) Filed: Aug. 29, 2003

(51) Int. Cl.
*H01L 21/44* (2006.01)

(52) U.S. Cl. ............... 148/518; 148/536; 438/660; 438/687

(58) Field of Classification Search ............... 148/518, 148/536; 438/660, 687
See application file for complete search history.

(56) References Cited

U.S. PATENT DOCUMENTS

| | | | |
|---|---|---|---|
| 6,433,402 B1 * | 8/2002 | Woo et al. ............... | 257/525 |
| 6,958,247 B2 * | 10/2005 | Marxsen et al. ............ | 438/8 |
| 2004/0014312 A1 * | 1/2004 | Kunishima et al. ......... | 438/637 |
| 2004/0198055 A1 * | 10/2004 | Wang ..................... | 438/692 |

* cited by examiner

*Primary Examiner*—George Wyszomierski
(74) *Attorney, Agent, or Firm*—Knobbe, Martens, Olson & Bear, LLP

(57) ABSTRACT

The present teachings and illustrations describe a process for forming a plurality of conductive structures in or on a substrate. In one embodiment, the process comprises forming a plurality of recesses in or on the substrate, wherein the plurality of recesses include recesses having different dimensions. In addition, the process further comprises (i) forming a conductive layer which at least partially fills the plurality of recesses and (ii) treating the conductive layer to improve the conductive properties of the conductive layer. Moreover, the process still further comprises (iii) sequentially repeating acts (i) and (ii) until each of the recesses of the plurality of recesses are filled to a desired dimension and such that the conductive material in the recesses of smaller dimension are more uniformly adhered to the bottom surfaces of the recesses.

16 Claims, 4 Drawing Sheets

INTERMEDIATE ANNEAL FOR METAL DEPOSITION

BACKGROUND OF THE INVENTION

1. Field of the Invention

The present invention relates to semiconductor technology and, in particular, relates to fabrication processes for conductive layers on substrates.

2. Description of the Related Art

Conventional fabrication of conductive structures, such as patterned interconnects, typically involves forming recesses, trenches, or vias in or on a substrate, and then filling or overfilling these features with various conductive materials, such as copper, poly-silicon, metal, or various metal alloys. Sometimes excessive conductive material, such as overfill or overburden, is removed by planarization using, for example, chemical mechanical polishing or the like to thereby form isolated conductive structures, such as traces, vias, wires, and/or wire bonding pads. Such metalization processes can sometimes avoid photolithographic mask and etching processing of conventional metal line definition.

In one such process, recessed features, such as trenches, vias, and wire bonding pads, are formed in an insulating substrate, such as an interlayer dielectric (ILD) layer, using reactive ion etching (RIE). In addition, electrochemical deposition (ECD) is sometimes used to deposit copper or various other conductive materials to a sufficient thickness to fill these features so as to form the desired conductive structures. In certain circumstances, a seed layer can first be deposited as part of the deposition process. In other circumstances, the deposition of copper material is preceded by the deposition of a thin barrier layer, which inhibits diffusion of copper into the underlying substrate or ILD layer. Moreover, the copper deposition is typically followed by annealing the copper by heating the wafer to a temperature between approximately 100° and 500° C. (e.g., 200° C.).

Unfortunately, defects can be introduced at various stages of processing (e.g., RIE, seed/barrier deposition, ECD, and CMP). In many cases, some of these defects can be removed with annealing processes. However, the excessive overburden of copper material above the conductive structures can create stresses during the annealing process, which can cause a multitude of defects and adversely impact the electrical characteristics of the copper material. For example, stresses created by the thermal cycling of heating and cooling during annealing can cause the copper material to lift off from a portion of the recessed trench or via, thereby creating voids, which can inhibit the conductive properties of the copper material.

In addition, conductive structures are typically formed in or on a substrate, including ILD layers, at various widths or pitches, wherein a via, for example, can be classified as a "smaller" recessed feature and a wire bonding pad, for example, can be classified as a relatively "larger" recessed feature. In general, conventional metalization techniques deposit or form a single layer of copper material on the substrate so as to simultaneously fill the "smaller" and "larger" recessed features, which results in excessive overfill or overburden of copper material above the "smaller" recessed feature or via.

Moreover, subsequent annealing of the copper layer can cause the copper material to flow at elevated temperatures. In general, the coefficient of thermal expansion (CTE) for copper is typically greater than the CTE for substrate materials including ILD layers. Thus, during annealing, copper material expands more than the substrate material at elevated temperatures. Unfortunately, the expansion forces of the copper and substrate material can cause copper to flow out of the "smaller" features. Typically, excessive overburden or thickness of copper material results in increased expansive stresses. Once cooled, the copper and substrate materials contract. In general, copper contracts more than the substrate due to the difference in the CTE. Therefore, the copper can shrink in the "smaller" features and the overburden can contract as well such that an excessive overburden of copper above the "smaller" features results in a larger contracting volume, which results in larger contracting forces pulling the copper out of the "smaller" features.

The contraction or shrinkage of the overburdened copper layer can cause the copper material to lift off from portions of the "smaller" recessed feature or via, thereby creating a void between the copper layer and portions of the "smaller" recessed feature. Therefore, there currently exists a need to improve the processing techniques associated with forming conductive structures so as to improve the physical and electrical characteristics thereof.

SUMMARY OF THE INVENTION

The aforementioned needs may be satisfied by a process for forming a plurality of conductive structures in a substrate. In one embodiment, the process may comprise forming a plurality of recesses in the substrate, wherein the plurality of recesses include recesses having different dimensions In addition, the process may further comprise (i) forming a conductive layer which at least partially fills the plurality of recesses and (ii) treating the conductive layer to improve the conductive properties of the conductive layer. Moreover, the process may still further comprise (iii) sequentially repeating acts (i) and (ii) until each of the recesses of the plurality of recesses are filled to a desired dimension and such that the conductive material in the recesses of smaller dimension are more uniformly adhered to the bottom surfaces of the recesses.

In one aspect, the process may further comprise forming a seed layer on the substrate so as to overlie the recesses, wherein forming the conductive layer may comprise forming the conductive layer on the seed layer. In addition, forming the seed layer comprises depositing a seed layer with conductive material selected from the group consisting of copper, nickel, and cobalt. Also, forming the seed layer comprises depositing a seed layer having a thickness of at least less than approximately 3000A.

In another aspect, forming a conductive layer comprises depositing a conductive material in the plurality of recesses selected from the group consisting of copper, nickel, and cobalt. In addition, forming a conductive layer comprises depositing a layer of conductive material using electrochemical deposition (ECD). Also, forming a plurality of recesses comprises forming at least one recess sized to receive a contact via or small pitch/width line and at least one recess sized to form a wire bonding pad.

In still another aspect, forming a plurality of recesses in the substrate includes recesses having different widths such that sequentially repeating acts (i) and (ii) until each of the recesses of the plurality of recesses are filled to a desired width and such that the conductive material in the recesses of smaller width are more uniformly adhered to the bottom surfaces of the recesses. In addition, forming a plurality of recesses comprises forming at least one first recessed region having a first range of width between approximately 0.05–0.35 µm and forming at least one second recessed region having a second range of width between approximately 0.45 µm or greater.

In still another aspect, treating the conductive layer comprises annealing the conductive layer at a temperature of approximately 200° C. for approximately 30 minutes. In addition, treating the conductive layer comprises annealing the conductive layer with a temperature gradient between approximately 160–220° C. for approximately 30–90 minutes. Also, treating the conductive layer comprises annealing the conductive layer with a temperature range between approximately 100–500° C.

The aforementioned needs may also be satisfied by a process for forming a plurality of conductive structures on a substrate. In one embodiment, the process may comprise forming a plurality of recesses in the substrate, wherein the plurality of recesses include recesses having different widths. In addition, the process may further comprise (i) forming a layer of copper material which at least partially fills the plurality of recesses and (ii) treating the layer of copper material to improve the conductive properties thereof. Moreover, the process may still further comprise (iii) sequentially repeating acts (i) and (ii) until each of the recesses of the plurality of recesses are filled to a desired width and such that the copper material in the recesses of smaller width are more uniformly adhered to the bottom surfaces of the recesses.

The aforementioned needs may also be satisfied by a fabrication method for forming conductive interconnects on a substrate. In one embodiment, the method may comprise forming at least one first recessed region to a first width in the substrate and forming at least one second recessed region to a second width in the substrate, wherein the second width is at least greater than the first width. In addition, the method may further comprise forming a first conductive layer so as to at least fill the first recessed region to a first fill width and annealing the first conductive layer. Moreover, the process may still further comprise forming a second conductive layer on the first conductive layer after annealing the first conductive layer so as to at least fill the second recessed region to a second fill width, wherein filling the second recessed region to the second fill width over fills the first recessed region and annealing the second conductive layer, and wherein the previous anneal of the first conductive layer inhibits separation of the conductive material from the lower surface of the first recessed region during the anneal of the second conductive layer.

These and other objects and advantages of the present invention will become more fully apparent from the following description taken in conjunction with the accompanying drawings.

DETAILED DESCRIPTION OF THE PREFERRED EMBODIMENT

Reference will now be made to the drawings wherein like numerals refer to like parts throughout. FIGS. 1–6 illustrate an improved method for plating interconnects on a substrate so as to reduce the adverse effects of stresses and interface voids caused by annealing. These improvements and other aspects of the present teachings will be described in greater detail herein below with reference to the drawings.

Figure 1:
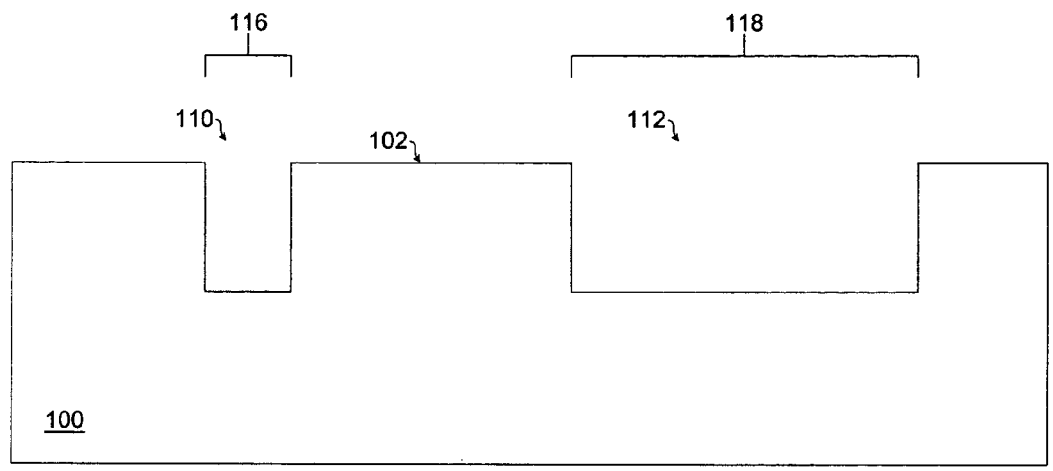
FIG. 1 illustrates one embodiment of a substrate having a surface with first and second recessed features formed therein.

FIG. 1 illustrates one embodiment of a substrate 100 having a surface 102 with first and second recessed features 110, 112 formed therein adjacent the substrate surface 102. In one embodiment, the first recessed feature 110 may comprise a relatively "smaller" type of recessed feature having a first width or pitch 116, such as a generally known via or Damascene structure. In addition, the second recessed feature 112 may comprise a relatively "larger" type of recessed feature having a second width or pitch 118 that is at least greater than the first width 116, such as a recess for a generally known wire bonding pad. It should be appreciated by those skilled in the art that the widths of the features 110, 112 may vary in magnitude without departing from the scope of the present teachings and should not be limited to the illustrated embodiment. In general, features of differing widths are a concern, which also may include array lines and power bus lines.

In general, formation of the recessed features 110, 112 may comprise a generally known photo-mask pattern and etch technique that is adapted to etch the substrate 100 below the surface 102 thereof to a desirable dimension, such as width, so as to define the shape or contour of features 110, 112. In one embodiment, the recessed features 110, 112 may be formed in the substrate 100 with reactive ion etching (RIE). In addition, as illustrated in FIG. 1, the recessed features 110, 112 may vary in size and width depending on the particular application or implementation such that, in one embodiment, the second recessed feature 112 is etched with a greater width than the first recessed feature 110. In one aspect, as illustrated in FIG. 1, the shape or contour of the recessed features 110, 112 may resemble a substantially rectangular shape. However, it should be appreciated by those skilled in the art that the shape or contour of the recessed features 110, 112 may comprise various other types of shapes or contours, such as circular, elliptical, cylindrical, triangular, etc., without departing from the scope of the present teachings.

In one embodiment of the present teachings, the first recessed feature 110 may comprise a "smaller" recessed region, such as a line, trace, trench, or via, having a width of at least less than approximately 0.45 microns (µm). In another embodiment, the "smaller" first recessed feature 110 may comprise a range of widths between approximately 0.05–0.35 µm. In addition, the "smaller" first recessed feature 110 may be defined in terms of "smaller" recessed area or volume having varying dimensional characteristics of length and depth (not shown) along with the previously defined widths. Therefore, in one aspect, it should be appreciated by those skilled in the art that the dimensional characteristics of the "smaller" first recessed feature 110, including the length, width, and depths or range of lengths, widths, and depths, may vary in magnitude depending on the particular application or implementation without departing from the scope of the present teachings.

Moreover, the second recessed feature 112 may comprise a "larger" recessed region, such as a recess for a wire bonding pad, having a range of widths between approximately 0.45–500 μm. In addition, the "larger" second recessed feature 112 may be defined in terms of "larger" recessed area or volume having dimensional characteristics of length and depth (not shown) along with the previously defined widths. Therefore, in one aspect, it should also be appreciated by those skilled in the art that the dimensional characteristics of the "larger" second recessed feature 112, including the length, width, and depths or range of lengths, widths, and depths, may vary in magnitude depending on the particular application or implementation without departing from the scope of the present teachings.

In another embodiment of the present teachings, the substrate 100 may be referred to as interlayer dielectric (ILD) and may comprise an insulative material, such as borophosphosilicate glass (BPSG) or various other generally known field oxide materials. In addition, the substrate 100 may comprise at least a portion of a conventional silicon wafer, but can more generally encompass structures comprising semiconductive material or variations thereof, including, but not limited to, bulk semiconductor materials such as a semiconductor wafer (either alone or in assemblies comprising other materials thereon), and semiconductive material layers (either alone or in assemblies comprising other materials). Moreover, the term "substrate" or "ILD" may also encompass any various supporting or layered structures, including, but not limited to, oxide or semiconductive structures, layers, or substrates. Furthermore, when reference is made to the substrate 100 within the following description, previous processing steps may have been utilized to form regions, structures, or junctions in or on its base oxide or semiconductor structure or foundation.

Further, in one embodiment, the substrate 100 may comprise one or more generally known conductive vias, plugs, traces, or contacts (not shown) that abut at least a portion of the features 110, 112. It should be appreciated that the one or more vias, plugs, traces, or contacts define one or more node regions (not shown) and may comprise a generally known electrical interconnect between the substrate 100 and one or more circuit components (not shown), such as a transistor or various other types of circuit components. In addition, it should also be appreciated that the features 110, 112 may be positioned in any region relative to the substrate 100 without departing from the scope of the present teachings.

Figure 2:
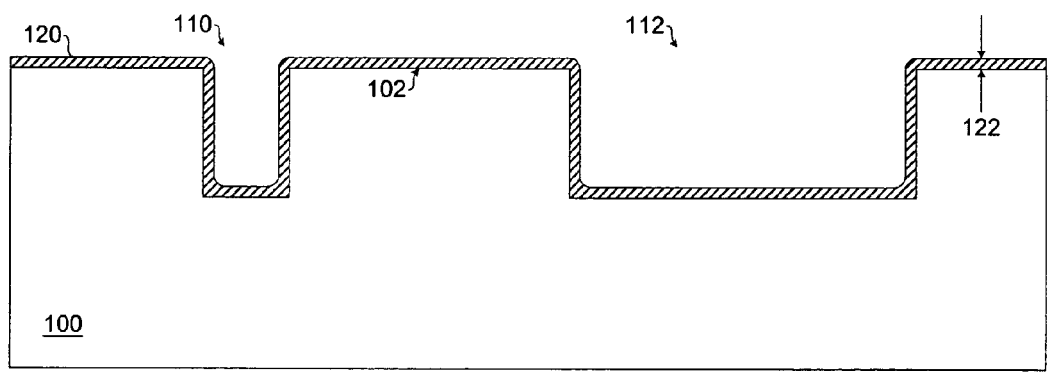
FIG. 2 illustrates the deposition of a seed layer on the substrate.

FIG. 2 illustrates the deposition or plating of a seed layer 120 on the substrate 100 so as to overlie the substrate surface 102 and the features 110, 112 formed therein. In one embodiment, the seed layer 120 may comprise a layer of conductive material, such as copper, nickel, or cobalt, that provides an atomically-smooth and cohesive interface that encourages the correct grain growth during the subsequent bulk fill processing steps. In addition, the formation of the seed layer 120 comprises a conformal deposition or superfilling of conductive material, such as copper, nickel, or cobalt, using, for example, an electrochemical deposition (ECD) technique to a sufficient thickness 122. It should be appreciated by those skilled in the art that various other conductive materials may be used without departing from the scope of the present teachings. In addition, it should also be appreciated that various other conformal deposition or plating processes, such as chemical vapor deposition (CVD), plasma enhanced CVD (PECVD), or the like, may be used to deposit the seed layer 120 to the sufficient thickness 122 without departing form the scope of the present teachings. Moreover, in one embodiment, the thickness 122 of the seed layer 120, for example, is at least less than approximately 3000A. Additionally, the deposition or plating of the seed layer 120 on the substrate 100 is considered optional and, therefore, the thickness 122 of the seed layer 120 may comprise a range between approximately 0–3000A.

Advantageously, the seed layer 120 can also improve the effectiveness of the subsequent bulk fill. In one aspect, it should be appreciated that deposition of the first conductive layer 120 is optional such that the seed layer 120 may or may not be formed or deposited prior to the subsequent processing steps as disclosed herein without departing from the scope of the present teachings. It should also be appreciated that the thickness 122 of the seed layer 120 may vary in magnitude depending on the particular application or implementation without departing from scope of the present teachings. Moreover, it should also be appreciated that various other deposition or plating techniques, such as sputtering or vacuum evaporation, may be used to form the seed layer 120 without departing from the scope of the present teachings.

Figure 3:
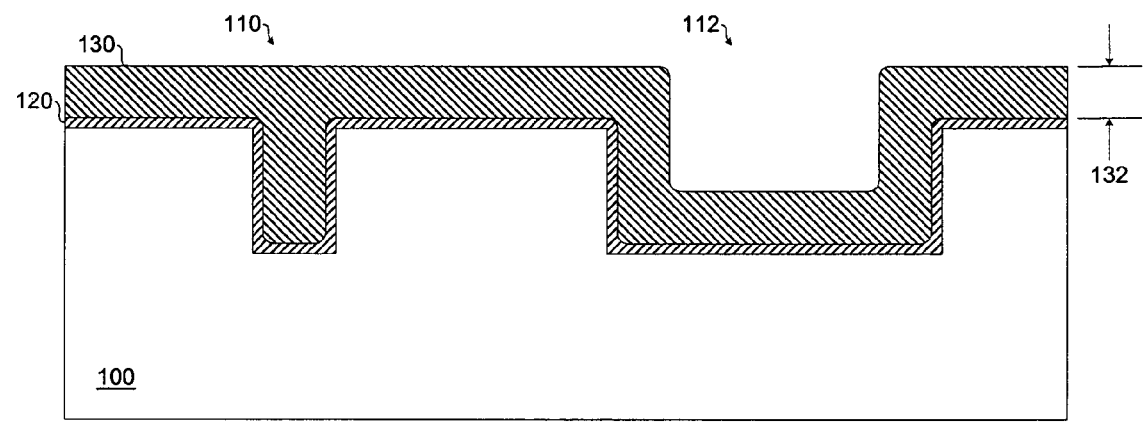
FIG. 3 illustrates the deposition of a first conductive layer on the seed layer.

FIG. 3 illustrates the deposition or plating of a first conductive layer 130 on the seed layer 120 so as to fill the first recessed feature 110 and at least partially fill the second recessed feature 112. In one embodiment, the formation of the first conductive layer 130 comprises a conformal deposition of conductive material, such as copper, nickel, or cobalt, using, for example, an ECD technique to a sufficient thickness 132. In general, the "smaller" recessed features 110 tend to fill before the "larger" recessed features 112, which may be related to the method of deposition. In one aspect, the "smaller" recessed features 110 fill fast from the bottom up, while the "larger" recessed features fill conformally. For example, a "smaller" or less wide recessed feature 110 may fill in approximately 20 seconds, and a "larger" or wider recessed feature 112 may fill in approximately 1.5 to 2.5 minutes. As with the deposition of the seed layer 120, it should be appreciated that various other conformal deposition or plating processes, such as CVD, PECVD, or similar technique, may be used to deposit the first conductive layer 130 to the sufficient thickness 132. In addition, it should also be appreciated by those skilled in the art that various other conductive materials may be used without departing from the scope of the present teachings.

In one embodiment, the deposition or plating of the first conductive layer 130 may be performed with accelerators, such as disulfides, suppressors, such as polyethylene glycol, and/or levelers in a generally known manner so as to reduce the "overburden" of the first conductive layer 130 on the substrate 100. In general, accelerator molecules are relatively small and promote deposition because they fit into small areas and accumulate, and suppressor molecules are relatively large and inhibit deposition. In one aspect, it should be appreciated that the thickness 132 of the first conductive layer 130 may vary in magnitude depending on the particular application or implementation without departing from scope of the present teachings. Moreover, it should also be appreciated that various other deposition or plating techniques, such as sputtering, vacuum evaporation, or the like, may be used to form the first conductive layer 130 without departing from the scope of the present teachings.

Figure 4:
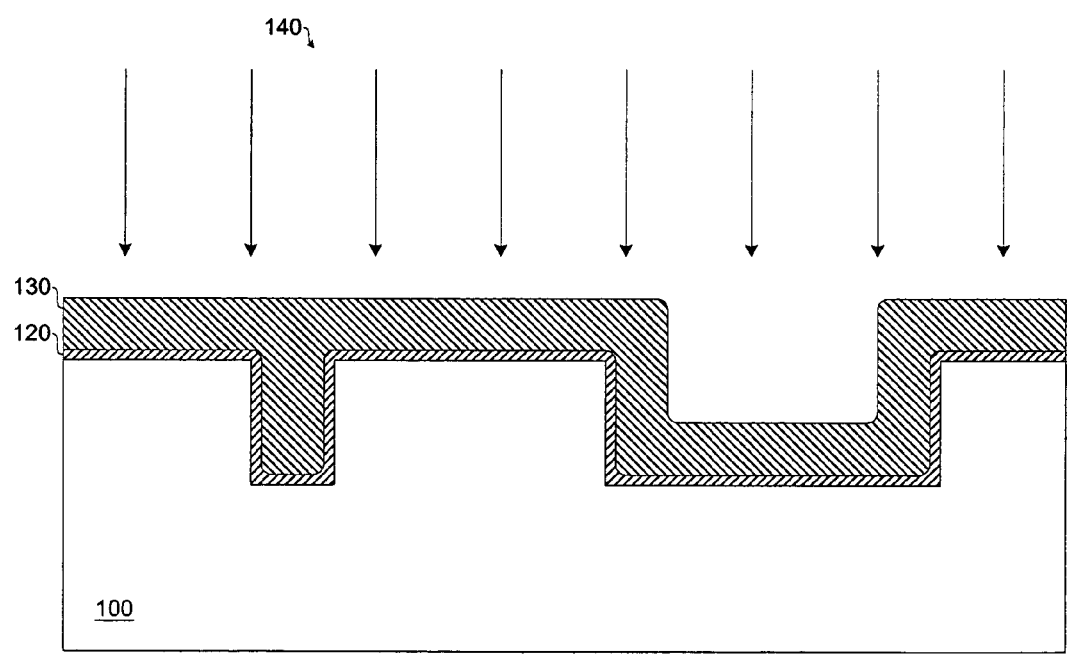
FIG. 4 illustrates the application of a first annealing process to the first conductive layer.

FIG. 4 illustrates a first annealing process 140 that is applied to the first conductive layer 130 so as to improve the physical and electrical characteristics thereof. For example, the first annealing process 140 may be applied to the first conductive layer 130 to relieve stresses, increase grain sizes, drive-off impurities, and improve conductivity. In addition, since defects can be introduced into the first conductive layer 130 during deposition, some of these defects can be removed therefrom with the first annealing process 140. For example, stresses created by the thermal cycling of heating and cooling can cause the conductive material of the first conductive layer 130 to lift from a portion of the substrate 100 adjacent the "smaller" first feature 110 thereby creating a void or gap therebetween.

Figure 5:
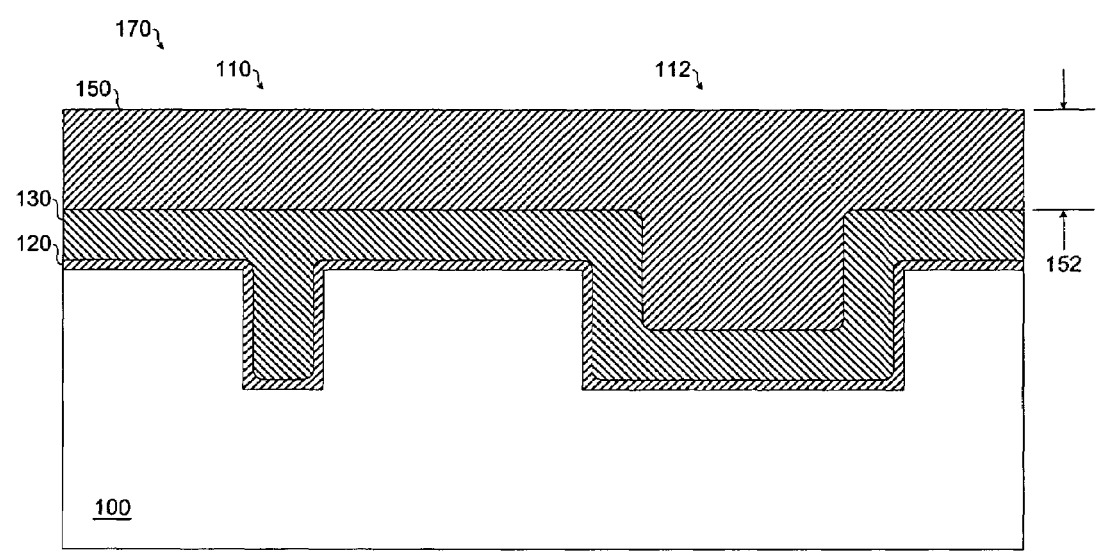
FIG. 5 illustrates the deposition of a second conductive layer on the first conductive layer.
Figure 6:
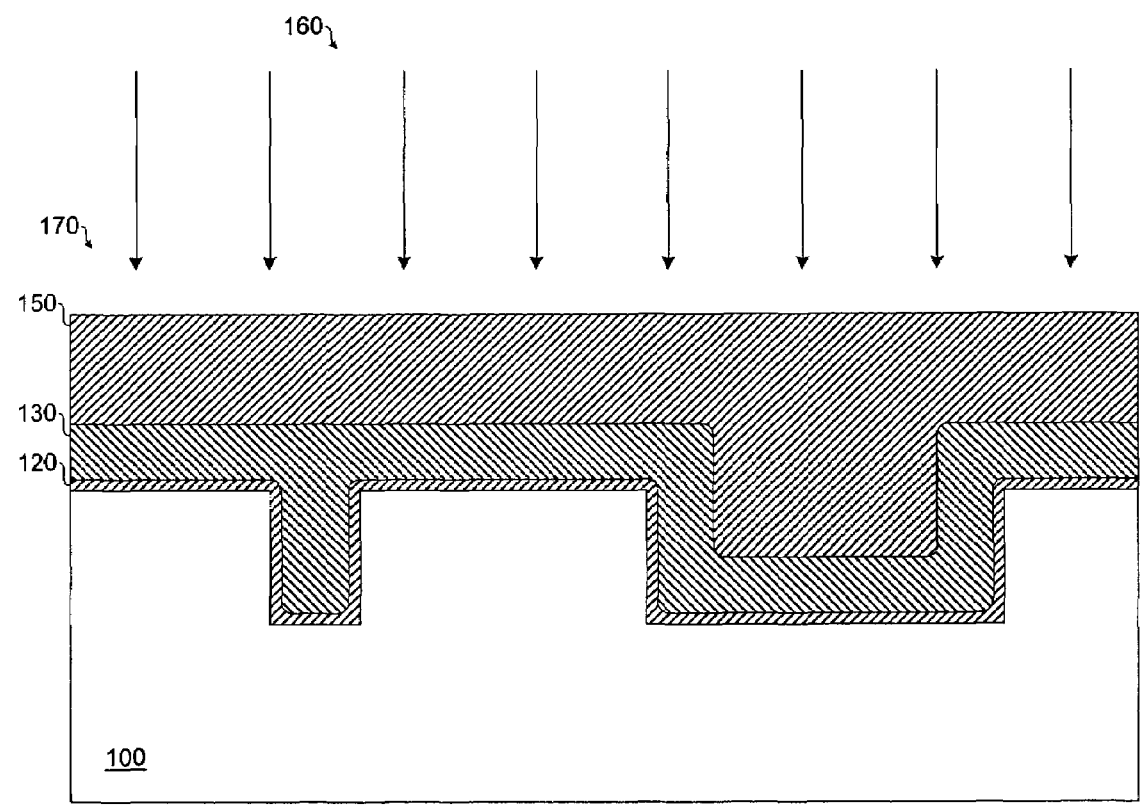
FIG. 6 illustrates the application of a second annealing process to the second conductive layer.

However, in the present teachings, deposition and annealing of the first conductive layer 130 are the initial processing steps in a multi-step plating process to form a conductive structure 170 as illustrated in FIGS. 5, 6. Therefore, the first conductive layer 130 can be deposited or plated with less overfill or overburden than the prior art technique. With less of an overburden of conductive material, such as copper, nickel, or cobalt, above the first recessed feature 110, the first annealing process 140 can advantageously reduce stresses that can cause adverse defects in the grain structure or void regions between the layer 130 and the substrate 100. In addition, the first annealing process 140 can more uniformly adhere the conductive material of the first conductive layer 130 to the interior surfaces of at least the "smaller" first recessed feature 110 to thereby provide, for example, improved conduction therebetween. It should be appreciated that interior surfaces may include side and bottom or lower surfaces without departing from the scope of the present teachings.

In one embodiment, the first annealing process 140 may comprise a batch annealing process in a vertical furnace. In addition, the first annealing process 140 may comprise a rapid thermal annealing (RTA) process or variation thereof. Also, in one embodiment, the first annealing process 140 may be performed in a temperature of approximately 200° C. for approximately 30 minutes. Moreover, the first annealing process 140 may be performed, for example, with a temperature gradient between approximately 160–220° C. for approximately 30–90 minutes. In general, the temperature range for the first annealing process 140 may vary, for example, between approximately 100–500° C. It should be appreciated by those skilled in the art that the temperature range and temporal range of the first annealing process 140 may vary without departing from the scope of the present teachings.

FIG. 5 illustrates the deposition or plating of a second conductive layer 150 on the annealed first conductive layer 130 so as to form a conductive structure 170. In one embodiment, as illustrate in FIG. 5, the second conductive layer 150 is deposited or plated on the first conductive layer 130 in a manner so as to overlie the first recessed feature 110 and fill at least the remaining portion of the second recessed feature 112. In one embodiment, the formation of the second conductive layer 150 comprises a bulk fill of conductive material, such as copper, nickel, or cobalt, using, for example, an electrochemical deposition (ECD) technique to a sufficient thickness 152. In one aspect, it should be appreciated that the thickness 152 of the second conductive layer 150 may vary in magnitude depending on the particular application or implementation without departing from scope of the present teachings. Moreover, as with the formation of the first conductive layer 130, it should also be appreciated that various other deposition or plating techniques, such as CVD, PECVD, sputtering, vacuum evaporation, or the like, may be used to form the second conductive layer 150 without departing from the scope of the present teachings. Furthermore, it should also be appreciated by those skilled in the art that various other conductive materials may be used without departing from the scope of the present teachings.

FIG. 6 illustrates a second annealing process 160 that is applied to the second conductive layer 150 so as to improve the physical and electrical characteristics thereof in a manner similar to the discussion related to the first conductive layer 130 in FIG. 4. For example, in one embodiment, the second annealing process 160 is applied to the second conductive layer 150 to relieve stresses and increase the conductivity in a manner as previously described with reference to FIG. 4. In addition, it should be appreciated by those skilled in the art that the second annealing process 160 may be performed within similar scope to that of the first annealing process 140 as previously described in FIG. 4 without departing from the scope of the present teachings.

In one aspect, the differing coefficients of thermal expansion (CTE) of deposited conductive structures, having conductive material such as copper, nickel, or cobalt, and the underlying wafer or substrate, having insulative material such as BPSG, can contribute to the production of defects by the annealing process in the prior art. However, according to the present teachings, by depositing the conductive layers 130, 150 in a multi-step plating and annealing process as disclosed herein, the resultant conductive structure 170 may comprise less grain defects and void regions to thereby provide improved physical and electrical characteristics. In one aspect of the present teachings, the first annealing process 140 serves as an intermediate annealing step interposed between the deposition or plating of the first and second conductive layers 130, 150. In addition, the second annealing step 160 serves as a subsequent annealing step after the deposition or plating of the second conductive layer 150. Advantageously, the layering and subsequent annealing of each layer 130, 150 forms an improved conductive structure 170 having improved physical and electrical characteristics.

Typically, copper and various other conductive materials, such as nickel and cobalt, have a different coefficient of thermal expansion (CTE) than many substrate materials so stresses can occur upon heating and/or cooling the "overburdened" structures as part of the annealing process. For example, when heated during the anneal, a copper "overburden" acts as a cap and stresses can be formed by the different expansions of the copper and the substrate material. During the anneal, the copper relaxes to relieve the stresses. In addition, the crystalline grains of copper experience Ostwald ripening in which some copper grains grow at the expense of other copper grains to minimize the overall free energy of the film. Upon cooling after the anneal, stresses are again formed by the different contraction of the copper and substrate material. In addition, the copper "overburden" and the copper structures can respond differently to the annealing process, thereby creating defect-inducing stresses. Certain embodiments of the present teachings as described herein reduce the stresses and interface voids caused by annealing the conductive structures after deposition thereof. Advantageously, by applying one or more deposition and annealing processes to form on or more conductive layers 130, 150 as disclosed herein, an improved conductive structure 170 can be formed with improved physical and electrical characteristics including improved adherence of conductive materials to recessed features formed in or on the substrate 100.

Although the above-disclosed embodiments of the present invention have shown, described, and pointed out the fundamental novel features of the invention as applied to the above-disclosed embodiments, it should be understood that various omissions, substitutions, and changes in the form of the detail of the devices, systems, and/or methods illustrated may be made by those skilled in the art without departing from the scope of the present invention. Consequently, the scope of the invention should not be limited to the foregoing description, but should be defined by the appended claims.

What is claimed is:

1. A fabrication method for forming conductive interconnects on a substrate, the method comprising;
    forming at least one first recessed region to a first width in the substrate;
    forming at least one second recessed region to a second width in the substrate, wherein the second width is at least greater than the first width;
    forming a first conductive layer of a first material in the presence of an accelerator that promotes formation of the first conductive layer so as to at least fill the first recessed region to a first fill width;
    annealing the first conductive layer;
    forming a second conductive layer of the first material on the first conductive layer after annealing the first conductive layer so as to least fill the second recessed region to a second fill width, wherein filling the second recessed region to the second fill width over fills the first recessed region; and
    annealing the second conductive layer wherein the previous anneal of the first conductive layer inhibits separation of the first conductive material from the lower surface of the first recessed region during anneal of the second conductive layer.

2. The method of claim 1, wherein the method further comprises depositing a seed layer on the substrate so as to overlie the first and second recessed regions.

3. The method of claim 2, wherein the first conductive layer is deposited on the seed layer so as to at least partially fill the first and second recessed regions.

4. The method of claim 2, wherein depositing the seed layer comprises depositing a conductive material selected from the group consisting of copper, nickel, and cobalt.

5. The method of claim 2, wherein depositing the seed layer comprises depositing a seed layer having a thickness of approximately 0–3000A.

6. The method of claim 1, wherein forming the at least one first recessed region in the substrate comprises forming at least one via in the substrate.

7. The method of claim 1, wherein forming the at least one second recessed region in the substrate comprises forming at least one bonding pad recess in the substrate.

8. The method of claim 1, wherein forming the at least one first recessed region comprises forming at least one recess having a width of approximately 0.45 microns (μm).

9. The method of claim 1, wherein forming the at least one first recessed region comprises forming at least one recessed region having a range of width between approximately 0.05–0.35 μm.

10. The method of claim 1, wherein depositing the first conductive layer comprises depositing a first conductive material selected from the group consisting of copper, nickel, and cobalt.

11. The method of claim 1, wherein depositing the second conductive layer comprises depositing a second conductive material selected from the group consisting of copper, nickel, and cobalt.

12. The method of claim 1, wherein depositing the second conductive layer comprises depositing a second layer of conductive material using electrochemical deposition (ECD).

13. The method of claim 1, wherein forming the at least one second recessed region comprises forming at least one recess having a range of width between approximately 0.45–500 μm.

14. The method of claim 1, wherein annealing the first and second conductive layers is performed at approximately 200° C. for approximately 30 minutes.

15. The method of claim 1, wherein annealing the first and second conductive layers is performed with a temperature gradient between approximately 160–220° C. for approximately 30–90 minutes.

16. The method of claim 1, wherein annealing the first and second conductive layers is performed at a temperature range between approximately 100–500° C.

* * * * *